United States Patent
Kim et al.

(10) Patent No.: US 9,899,361 B2
(45) Date of Patent: Feb. 20, 2018

(54) SEMICONDUCTOR PACKAGE

(71) Applicant: Samsung Electronics Co., Ltd., Suwon-si, Gyeonggi-do (KR)

(72) Inventors: Hyoungjoon Kim, Seoul (KR); Kwangil Park, Yongin-si (KR); Seok-Hong Kwon, Hwaseong-si (KR); Chulsung Park, Seoul (KR); Eunsung Seo, Seoul (KR); Heejin Lee, Seongnam (KR); Kijong Park, Incheon (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 15/254,259

(22) Filed: Sep. 1, 2016

(65) Prior Publication Data
US 2017/0141092 A1    May 18, 2017

(30) Foreign Application Priority Data
Nov. 12, 2015    (KR) .................. 10-2015-0158942

(51) Int. Cl.
*H01L 23/02*    (2006.01)
*H01L 25/18*    (2006.01)
(Continued)

(52) U.S. Cl.
CPC ............ *H01L 25/18* (2013.01); *H01L 24/73* (2013.01); *H01L 25/0652* (2013.01); *H01L 25/0657* (2013.01); *H01L 2224/16145* (2013.01); *H01L 2224/32145* (2013.01); *H01L 2224/73253* (2013.01); *H01L 2225/06513* (2013.01); *H01L 2225/06517* (2013.01); *H01L 2225/06527* (2013.01); *H01L 2225/06562* (2013.01); *H01L 2225/06568* (2013.01); *H01L 2225/06589* (2013.01); *H01L 2924/1431* (2013.01); *H01L 2924/1434* (2013.01)

(58) Field of Classification Search
CPC ..... H01L 25/18; H01L 25/0657; H01L 24/73; H01L 25/0652
USPC ........................................................ 257/686
See application file for complete search history.

(56) References Cited

U.S. PATENT DOCUMENTS 6,507,115 B1    1/2003   Hofstee et al.
6,825,567 B1    11/2004  Wang et al.
(Continued)

FOREIGN PATENT DOCUMENTS

KR          10-1099578 B1     12/2011
KR       10-2014-0056875 A     5/2014
(Continued)

*Primary Examiner* — Luan C Thai
(74) *Attorney, Agent, or Firm* — Harness, Dickey & Pierce, P.L.C.

(57) ABSTRACT

A semiconductor package includes a logic chip mounted on a substrate, a first memory chip disposed on the logic chip, which includes a first active surface, and a second memory chip disposed on the first memory chip. The second memory chip is disposed on the first memory chip in such a way that the first memory chip and second memory chip are offset from each other. The second memory chip has a second active surface. The first active surface and the second active surface face each other and are electrically connected to each other through a first solder bump.

12 Claims, 14 Drawing Sheets

(51) Int. Cl.
  *H01L 23/00*  (2006.01)
  *H01L 25/065*  (2006.01)

(56) References Cited

U.S. PATENT DOCUMENTS

| | | |
|---|---|---|
| 7,095,104 B2 | 8/2006 | Blackshear |
| 7,989,940 B2 | 8/2011 | Haba et al. |
| 8,519,537 B2 | 8/2013 | Jeng et al. |
| 8,597,986 B2 | 12/2013 | Wang et al. |
| 8,716,859 B2 | 5/2014 | Meyer et al. |
| 8,736,075 B2 * | 5/2014 | Choi ................... H01L 25/16 257/686 |
| 8,803,336 B2 | 8/2014 | Lee et al. |
| 8,896,126 B2 | 11/2014 | Setardja |
| 8,922,005 B2 | 12/2014 | Hu et al. |
| 8,981,547 B2 | 3/2015 | Crisp et al. |
| 9,082,686 B2 | 7/2015 | Lee et al. |
| 9,087,765 B2 | 7/2015 | Chun et al. |
| 9,105,503 B2 | 8/2015 | Kim et al. |
| 9,158,344 B2 | 10/2015 | Pyeon |
| 9,236,335 B2 | 1/2016 | Ishikawa |
| 9,263,370 B2 | 2/2016 | Shenoy et al. |
| 9,275,688 B2 | 3/2016 | Kim et al. |
| 9,583,472 B2 * | 2/2017 | Chung ................. H01L 21/565 |
| 2008/0197469 A1 | 8/2008 | Yang et al. |
| 2015/0113195 A1 | 4/2015 | Kim |

FOREIGN PATENT DOCUMENTS

| | | |
|---|---|---|
| KR | 10-2014-0060378 A | 5/2014 |
| KR | 10-2014-0099107 A | 8/2014 |
| KR | 10-2014-0112944 A | 9/2014 |

* cited by examiner

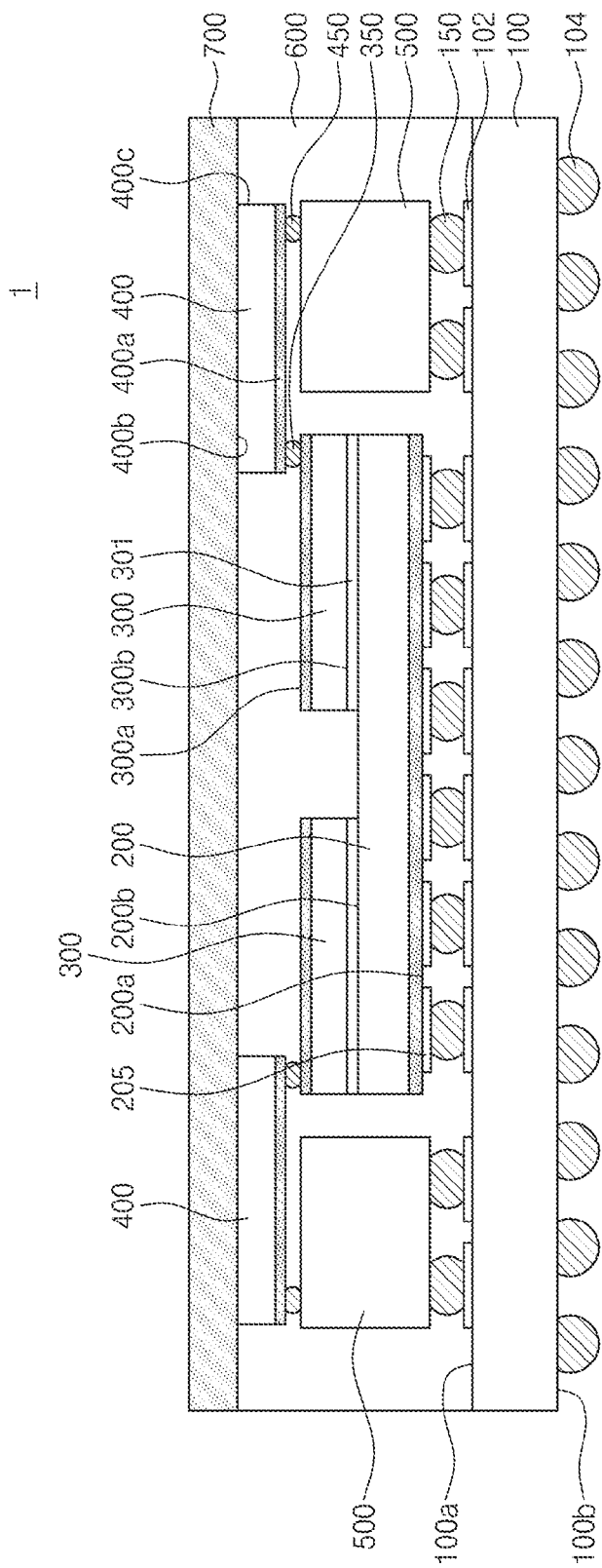

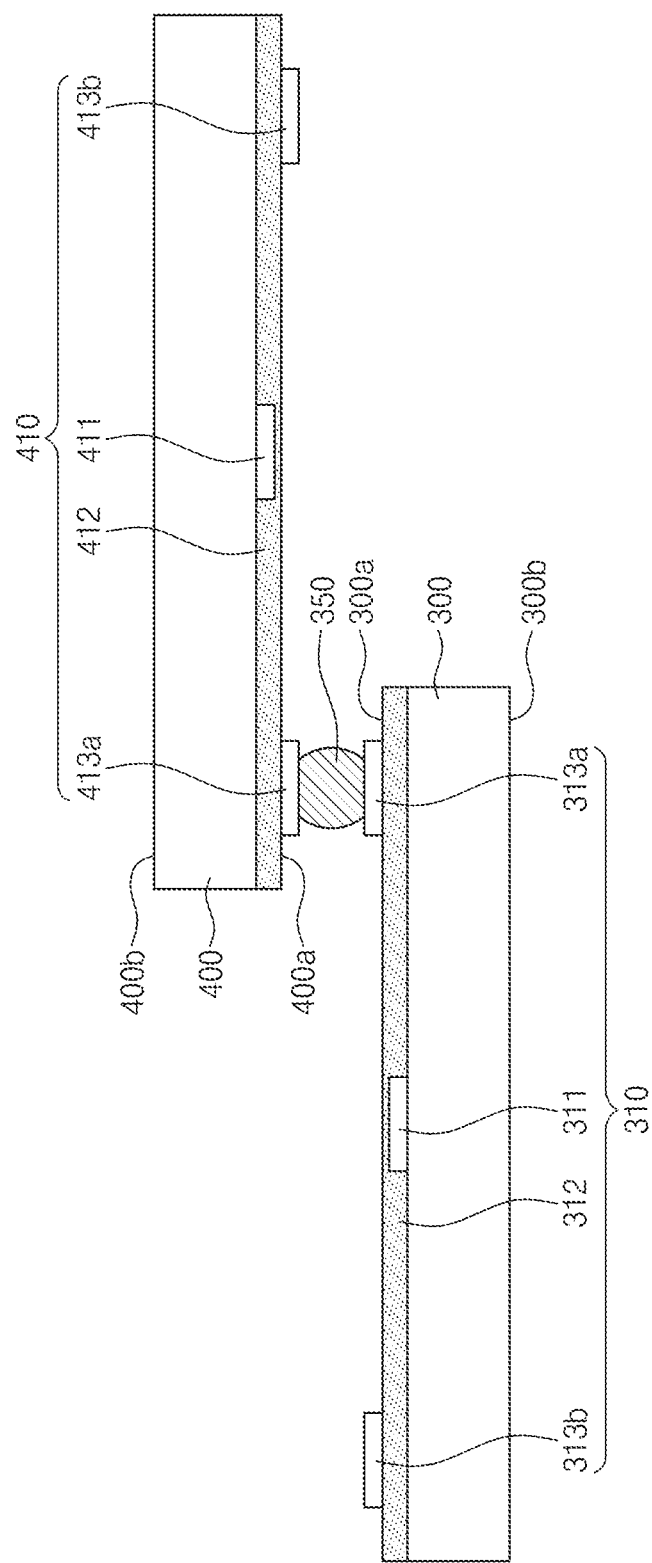

SEMICONDUCTOR PACKAGE

CROSS-REFERENCE TO RELATED APPLICATION

This U.S. non-provisional patent application claims priority under 35 U.S.C. § 119 to Korean Patent Application No. 10-2015-0158942, filed on Nov. 12, 2015, in the Korean Intellectual Property Office (KIPO), the disclosure of which is hereby incorporated by reference in its entirety.

BACKGROUND

1. Field

Example embodiments of inventive concepts relate to semiconductor packages such as semiconductor packages including memory chips having active layers, which face each other.

2. Description of Related Art

Small-sized and high-capacity semiconductor devices have been demanded with the development of semiconductor technology. To satisfy these demands, a plurality of semiconductor chips may be stacked on one package substrate, and/or a package may be stacked on another package.

In general, a through-silicon via (TSV) process, a flip-chip bonding process, and/or a wire bonding process may be used to stack a plurality of memory chips on a package substrate.

SUMMARY

Example embodiments of inventive concepts may provide image sensors with enhanced charge transmission efficiency and enhanced fill factor.

In an example embodiment, a semiconductor package may include a logic chip on a substrate, a first memory chip on the logic chip, the first memory chip including a first active surface, and a second memory chip on the first memory chip such that the first memory chip is offset from the second memory chip. The second memory chip may include a second active surface. The first active surface and the second active surface may oppose each other and may be operatively connected to each other through a first solder bump.

In an example embodiment, a semiconductor package may include a logic chip on a substrate along a vertical axis, a first memory chip vertically overlapping the logic chip and including a first active surface and a first non-active surface, and a second memory chip on the first memory chip such that the first and second memory chips constitute an offset structure. The second memory chip may include a second active surface and a second non-active surface. The first memory chip may include a first redistribution line on the first active surface, and the second memory chip may include a second redistribution line on the second active surface. The first active surface and the second active surface may oppose each other such that the first redistribution line is operatively connected to the second redistribution line.

In an example embodiment, a semiconductor package may comprise a first distribution line including a first connection pad and an electrode pad, the first distribution line on a first surface of a first memory chip, and a second distribution line including a second connection pad, the second distribution line on a second surface of a second memory chip. The first surface and the second surface oppose each other by having a central portion of the first memory chip offset from a central portion of the second memory chip such that at least one of the first connection pad and the electrode pad align with the second connection pad along a vertical axis to operatively connect the first and second memory chips.

BRIEF DESCRIPTION OF THE DRAWINGS

Inventive concepts will become more apparent in view of the attached drawings and accompanying detailed description of non-limiting embodiments of inventive concepts. The drawings are not necessarily to scale, emphasis instead being placed upon illustrating principles of inventive concepts. In the drawings:

FIG. 1 is a cross-sectional view illustrating a semiconductor package according to some example embodiments of inventive concepts.

FIGS. 2A and 2B are cross-sectional views illustrating memory chips according to some example embodiments of inventive concepts.

DETAILED DESCRIPTION OF EXAMPLE EMBODIMENTS

Figure 2B:
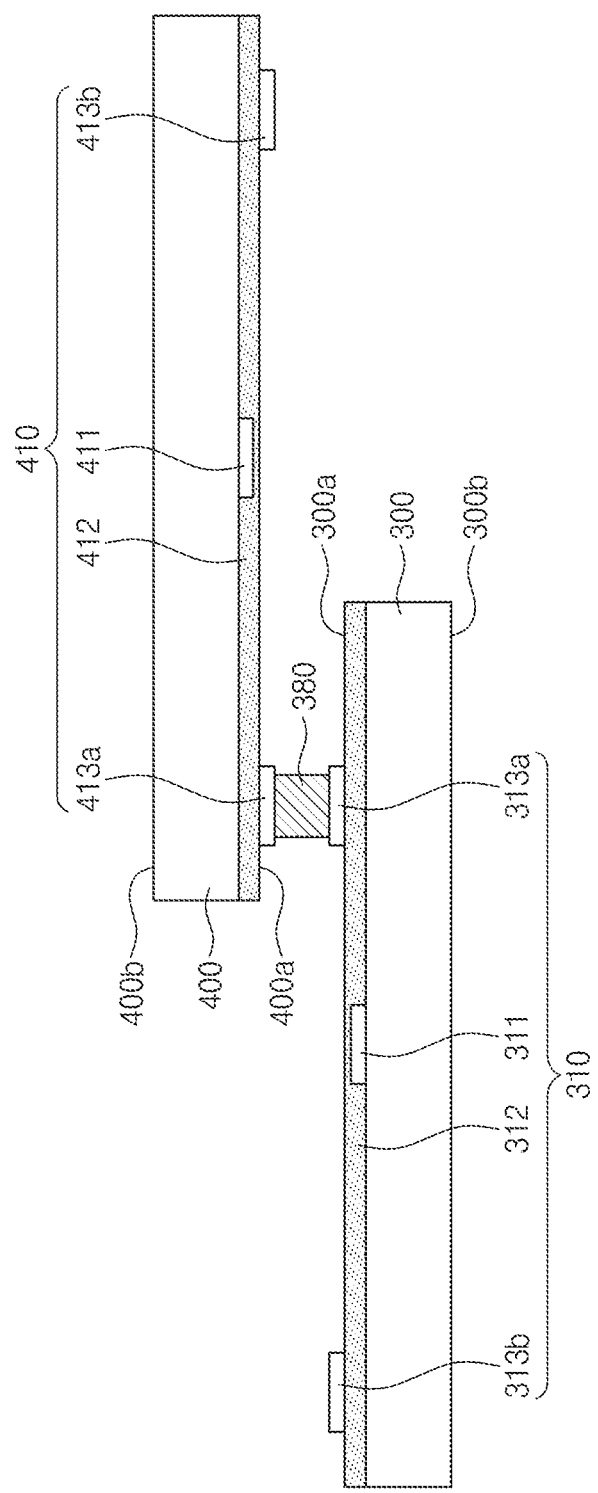

Example embodiments of aspects of inventive concepts explained and illustrated herein include their complementary counterparts. The same reference numerals or the same reference designators denote the same elements throughout the specification.

FIG. 1 is a cross-sectional view illustrating a semiconductor package according to some example embodiments of inventive concepts.

Referring to FIG. 1, a semiconductor package 1 may include a substrate 100, a logic chip 200, a first memory chip 300, a second memory chip 400, a bonding member 500, and a mold layer 600.

The substrate 100 may have a top surface 100a and a bottom surface 100b opposite to the top surface 100a. The substrate 100 may be a printed circuit board (PCB) having a circuit interconnection disposed therein. At least one mounting pad 102 may be disposed on the top surface 100a of the substrate 100, and at least one external terminal 104 may be provided on the bottom surface 100b of the substrate 100. The external terminal 104 may include at least one of tin (Sn), lead (Pb), nickel (Ni), gold (Au), silver (Ag), copper (Cu), or bismuth (Bi).

The logic chip 200 included in the semiconductor package 1 may be disposed on the top surface 100a of the substrate 100. The logic chip 200 may have an active surface 200a facing the substrate 100 and a non-active surface 200b opposite to the active surface 200a. A pad 205 may be disposed on the active surface 200a of the logic chip 200. A connection terminal 150 may be provided between the pad 205 and the mounting pad 102 of the substrate 100, and the logic chip 200 may be bonded to the top surface 100a of the substrate 100 through the connection terminal 150 by a flip-chip bonding technique. The logic chip 200 may be including but not limited to a controller or microprocessor which includes a logic device.

Still referring to FIG. 1, the first memory chip 300 included in the semiconductor package 1 may be disposed on the non-active surface 200b of the logic chip 200. One or more first memory chips 300 may be provided. For example, a plurality of the first memory chips 300 may be provided, and the plurality of first memory chips 300 may be spaced apart from each other on the logic chip 200. The first memory chip 300 may have a first active surface 300a and a first non-active surface 300b opposite to the first active surface 300a. A circuit pattern may be provided on the first active surface 300a, and the first non-active surface 300b may face the logic chip 200. For example, the first memory chip 300 may include but not limited to a dynamic random access memory (DRAM) device, a static random access memory (SRAM) device, a flash memory device, a phase-change random access memory (PRAM) device, a resistive random access memory (ReRAM) device, a ferroelectric random access memory (FeRAM) device, or a magnetic random access memory (MRAM) device. However, example embodiments of inventive concepts are not limited thereto. An adhesive layer 301 may be provided between the first memory chip 300 and the logic chip 200. The adhesive layer 301 may be a non-conductive film (NCF), an anisotropic conductive film (ACF), an ultraviolet (UV) sensitive film, a quick-drying glue, a thermosetting adhesive, a laser hardening adhesive, an ultrasonic hardening adhesive, and/or a non-conductive paste (NCP). The first memory chip 300 may be bonded to the non-active surface 200b of the logic chip 200 by the adhesive layer 301.

Still referring to FIG. 1, the second memory chip 400 included in the semiconductor package 1 may be disposed on the first memory chip 300. The second memory chip 400 may be disposed on the first memory chip 300 in such a way that the first and second memory chips 300 and 400 constitute an offset structure. In other words, a center of the second memory chip 400 may be laterally offset from a center of the first memory chip 300. For example, a portion of the second memory chip 400 may overlap with a portion of the first memory chip 300. In some example embodiments, one or more second memory chips 400 may be provided in the semiconductor package 1. The second memory chip 400 may have a second active surface 400a facing the first memory chip 300, a second non-active surface 400b opposite to the second active surface 400a, and sidewalls 400c connected between edges of the second active surface 400a and edges of the second non-active surface 400b. For example, the second memory chip 400 may include but not limited to a DRAM device, a SRAM device, a flash memory device, a PRAM device, a ReRAM device, a FeRAM device, and/or a MRAM device. However, example embodiments of inventive concepts are not limited thereto.

The first memory chips 300 and the second memory chips 400 may be stacked in a step form. The first active surface 300a of the first memory chip 300 may face the second active surface 400a of the second memory chip 400. The first memory chip 300 may be electrically connected to the second memory chip 400 through at least one first solder bump 350. The first solder bump 350 may include at least one of tin (Sn), lead (Pb), nickel (Ni), gold (Au), silver (Ag), copper (Cu), or bismuth (Bi).

Still referring to FIG. 1, the bonding member 500 included in the semiconductor package 1 may be disposed between the second memory chip 400 and the substrate 100. A plurality of bonding members 500 may be provided, and may be spaced apart from the logic chip 200. The bonding member 500 may be a printed circuit board (PCB) including a circuit pattern disposed therein. For example, the bonding member 500 may be an interposer. The bonding member 500 may electrically connect the second active surface 400a of at least one second memory chip 400 to the substrate 100. The interposer 500 may be connected to the second active surface 400a of the second memory chip 400 through a second solder bump 450, and may be connected to the substrate 100 through at least one connection terminal 150. The second solder bump 450 may include at least one of tin (Sn), lead (Pb), nickel (Ni), gold (Au), silver (Ag), copper (Cu), or bismuth (Bi).

The mold layer 600 included in the semiconductor package 1 may cover the top surface 100a of the substrate 100, the first memory chip 300, and the sidewalls 400c of the second memory chips 400. The mold layer 600 may expose the second non-active surfaces 400b of the second memory chips 400. A top surface of the mold layer 600 may be disposed at the same level as the second non-active surface 400b of the second memory chip 400. The mold layer 600 may include an insulating polymer material such as an epoxy molding compound (EMC).

A heat dissipation layer 700 included in the semiconductor package 1 may be disposed on the mold layer 600. The heat dissipation layer 700 may cover the second non-active surface 400b of the second memory chip 400. The heat dissipation layer 700 may include a thermal interface material (TIM). The heat dissipation layer 700 may be in direct contact with the second non-active surface 400b of the second memory chip 400 to exhaust heat generated from the second memory chip 400.

According to some example embodiments of inventive concepts, the logic chip 200 may not be connected directly to the memory chips 300 and 400 but may be electrically connected to the memory chips 300 and 400 through the substrate 100. Signals and/or data provided from the logic chip 200 may be transmitted to the first memory chip 300 and the second memory chip 400 through the substrate 100 and the bonding member 500. In addition, the logic chip 200 may be electrically connected to the first and second memory chips 300 and 400 without a through-silicon via (TSV) process, and thus a process cost of the semiconductor package 1 may be reduced. Furthermore, since a wire bonding process is not used, the semiconductor package 1 can be thinned.

FIGS. 2A and 2B are cross-sectional views illustrating memory chips according to some example embodiments of inventive concepts.

Referring to FIGS. 1 and 2A, and more particularly to FIG. 2A, the first memory chip 300 may include a first redistribution line 310 disposed on the first active surface 300a, and the second memory chip 400 may include a second redistribution line 410 disposed on the second active surface 400a. The first active surface 300a and the second active surface 400a may be disposed to face each other as shown in FIG. 2A.

The first redistribution line 310 included in the first memory chip 300 may include a first electrode pad 311, a first metal line 312, a first connection pad 313a, and a second connection pad 313b, as shown in FIG. 2A. The first electrode pad 311 may be connected to an inner circuit (not shown) provided in the first memory chip 300. The first connection pad 313a and the second connection pad 313b may be electrically connected to the first electrode pad 311 through the first metal line 312. The first connection pad 313a may be provided on a first edge of the first active surface 300a, and the second connection pad 313b may be provided on a second edge, opposite to the first edge, of the first active surface 300a. The first connection pad 313a and the second connection pad 313b may be symmetrical with respect to the first electrode pad 311.

Still referring to FIG. 2A, the second redistribution line 410 included in the second memory chip 400 may include a second electrode pad 411, a second metal line 412, a third connection pad 413a, and a fourth connection pad 413b. The second electrode pad 411 may be connected to an inner circuit (not shown) provided in the second memory chip 400. The third connection pad 413a and the fourth connection pad 413b may be electrically connected to the second electrode pad 411 through the second metal line 412. The third connection pad 413a may be provided on a third edge of the second active surface 400a, and the fourth connection pad 413b may be provided on a fourth edge, opposite to the third edge, of the second active surface 400a. The third connection pad 413a and the fourth connection pad 413b may be symmetrical with respect to the second electrode pad 411.

The first memory chip 300 may be electrically connected to the second memory chip 400 through at least one first solder bump 350. For example, the first solder bump 350 may be a solder ball. The first connection pad 313a may vertically overlap with the third connection pad 413a, and the first solder bump 350 may be provided between the first connection pad 313a and the third connection pad 413a.

The fourth connection pad 413b may be electrically connected to the substrate 100 through the bonding member 500. The second solder bump 450 may be provided between the fourth connection pad 413b and the bonding member 500.

Referring to FIGS. 1 and 2B, and more particularly to FIG. 2B, the first memory chip 300 may be electrically connected to the second memory chip 400 through a first solder bump 380. For example, the first solder bump 380 may be a conductive pillar. The conductive pillar may include copper (Cu), for example.

Figure 3:
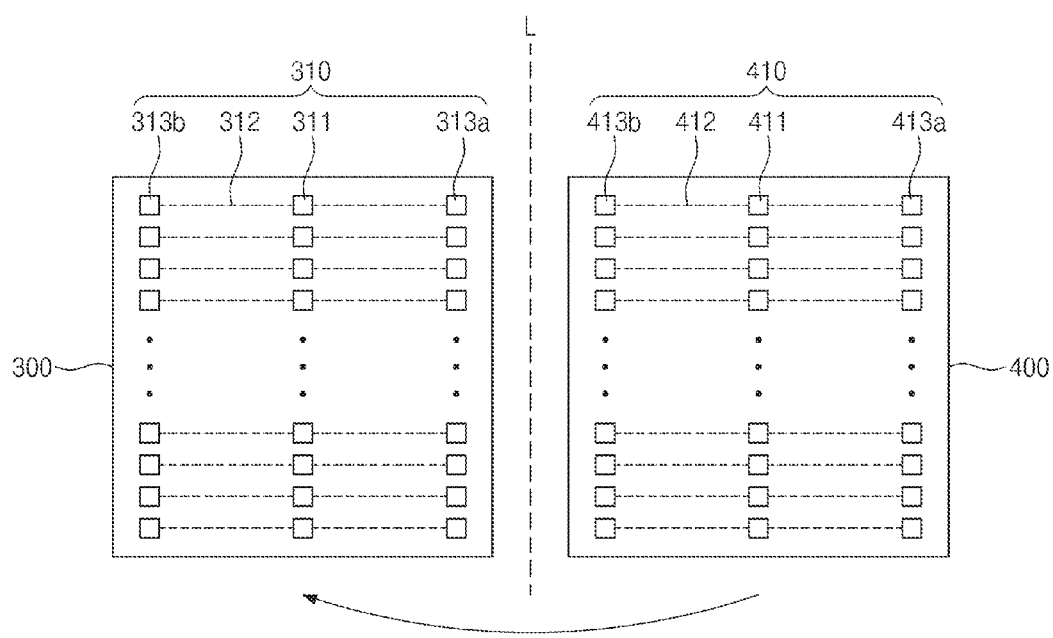
FIG. 3 is a view illustrating coupling relation between a first memory chip and a second memory chip according to some example embodiments of inventive concepts.

FIG. 3 is a view illustrating coupling relation between a first memory chip and a second memory chip according to some example embodiments of inventive concepts.

Referring to FIGS. 1, 2A, 2B, and 3, and more particularly to FIG. 3, the first redistribution line 310 including multiple first electrode pads 311, multiple first connection pads 313a, and multiple second connection pads 313b may be provided on the first memory chip 300. FIGS. 2A and 2B illustrate one first electrode pad 311, one first connection pad 313a, one second connection pad 313b, one second electrode pad 411, one third connection pad 413a, and one fourth connection pad 413b. However, one of ordinary skill in the art would appreciate that example embodiments may include multiple first electrode pads 311, multiple first connection pads 313a, multiple second connection pads 313b, multiple second electrode pads 411, multiple third connection pads 413a, and multiple fourth connection pads 413b, as shown in FIG. 3 for example.

The multiple first electrode pads 311 may be arranged in one direction and may be spaced apart from each other. Likewise, the multiple first connection pads 313a may be arranged in one direction and may be spaced apart from each other. The multiple second connection pads 313b may be arranged in one direction and may be spaced apart from each other. As shown in FIG. 3, the multiple first connection pads 313a and the multiple second connection pads 313b may be electrically connected to the multiple first electrode pads 311 through multiple first metal lines 312. The multiple first connection pads 313a and the multiple second connection pads 313b may be symmetrical with respect to the multiple first electrode pads 311.

Still referring to FIG. 3, the second redistribution line 410 including the multiple second electrode pads 411, the multiple third connection pads 413a, and the multiple fourth connection pads 413b may be provided on the second memory chip 400. The multiple second electrode pads 411 may be arranged in one direction and may be spaced apart from each other. Likewise, the multiple third connection pads 413a may be arranged in one direction and may be spaced apart from each other. The multiple fourth connection pads 413b may be arranged in one direction and may be spaced apart from each other. The multiple third connection pads 413a and the multiple fourth connection pads 413b may be electrically connected to the multiple second electrode pads 411 through the multiple second metal lines 412. The multiple third connection pads 413a and the multiple fourth connection pads 413b may be symmetrical with respect to the multiple second electrode pads 411.

The first redistribution line 310 may have the same structure as the second redistribution line 410 when viewed from a plan view. When the second memory chip 400 is rotated 180 degrees with respect to a reference line L and stacked on the first memory chip 300 in such a way that the first and second memory chips 300 and 400 constitute the offset structure such that the multiple third connection pads 413a may vertically overlap with the multiple first connection pads 313a, respectively. Since each of the first and second redistribution lines 310 and 410 has a bilateral symmetrical structure, the first and the second redistribution lines 310 and 410 may have the same structure in a plan view even though the second memory chip 400 is rotated. Thus, the first memory chip 300 may be electrically connected to the second memory chip 400 through the solder bumps without an additional circuit line.

In addition, the first memory chip 300 and the second memory chip 400 may be formed on a wafer by the same semiconductor processes and may be separated from each other by performing a singulation process on the wafer. Since the first active surface 300a of the first memory chip 300 and the second active surface 400a of the second memory chip 400 are mirror-symmetrical, the first and second memory chips 300 and 400 separated from the same wafer may be directly used to form the semiconductor package 1.

The same signals and/or the same data may be transmitted to the multiple first connection pads 313a and the multiple third connection pads 413a, which are electrically connected to each other. Thus, the first and second memory chips 300 and 400 may be controlled at the same time by one chip selection signal (CS) transmitted from the logic chip 200. In addition, a plurality of memory chips may be stacked to design a total capacity of the semiconductor package 1, and the number of input/output (I/O) pins may be adjusted by designing the first and second redistribution lines 310 and 410.

Figure 4:
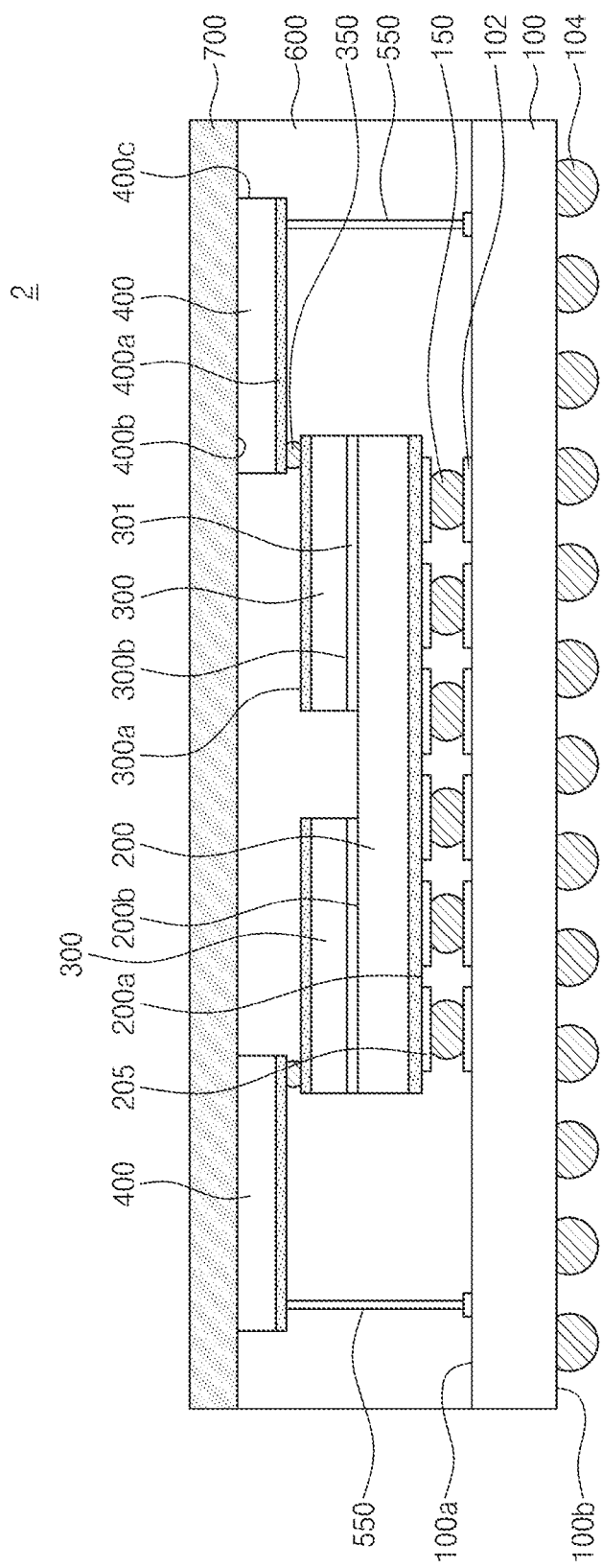
FIG. 4 is a cross-sectional view illustrating a semiconductor package according to some example embodiments of inventive concepts.

FIG. 4 is a cross-sectional view illustrating a semiconductor package according to some example embodiments of inventive concepts. In the present example embodiment, the same descriptions as in example embodiment described with reference to FIG. 1 apply, and as such discussion of the same features is omitted for purposes of ease and convenience in explanation.

Referring to FIG. 4, a semiconductor package 2 may include a bonding member 550 electrically connecting the second memory chip 400 to the substrate 100. The bonding member 550 may be a pillar or a through-mold via (TMV). For example, the bonding member 550 may include a conductive material including copper (Cu). The bonding member 550 may have a pillar shape formed of the conductive material. The bonding member 550 may electrically connect the second memory chip 400 to the substrate 100.

Figure 5:
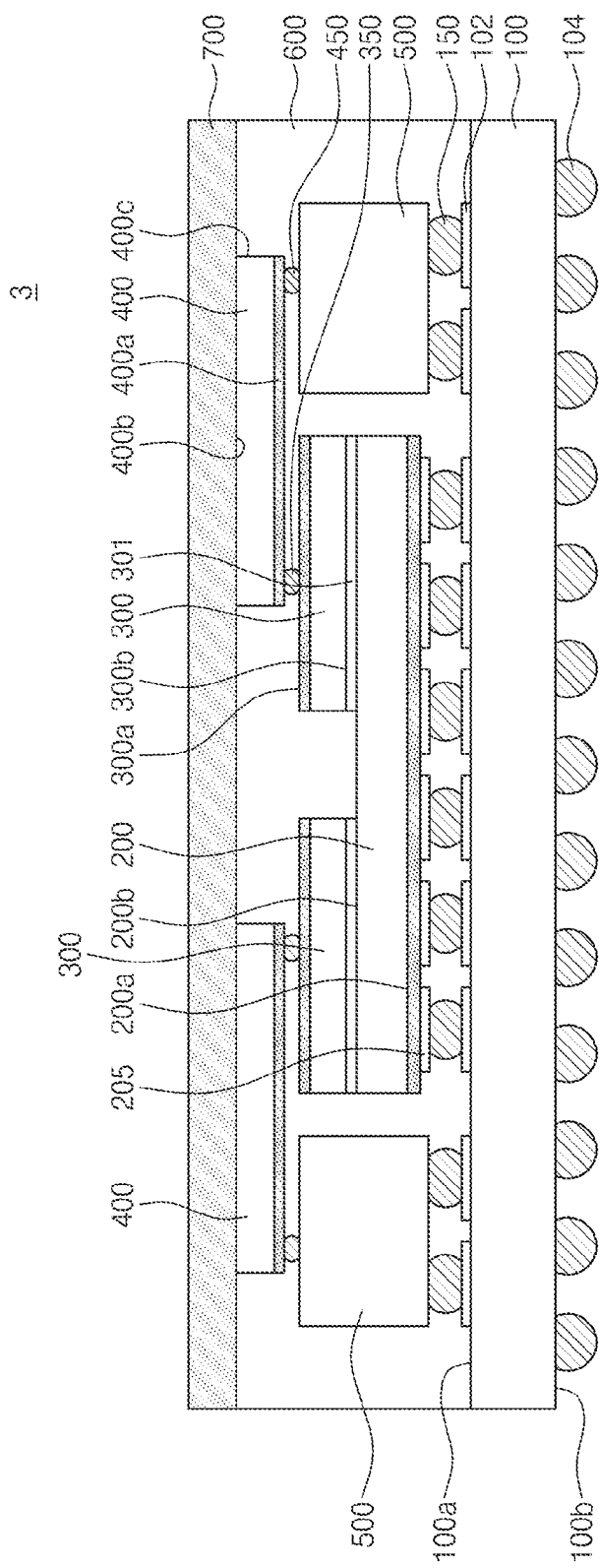
FIG. 5 is a cross-sectional view illustrating a semiconductor package according to some example embodiments of inventive concepts.

FIG. 5 is a cross-sectional view illustrating a semiconductor package according to some example embodiments of inventive concepts.

Figure 6:
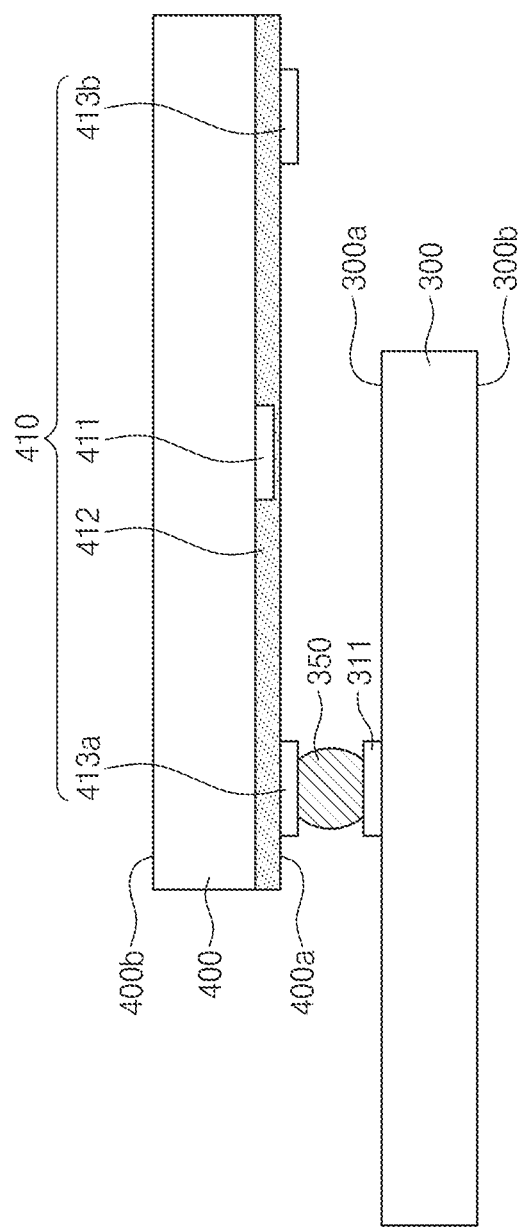
FIG. 6 is a cross-sectional view illustrating memory chips according to some example embodiments of inventive concepts.

FIG. 6 is a cross-sectional view illustrating memory chips according to some example embodiments of inventive concepts.

Figure 7:
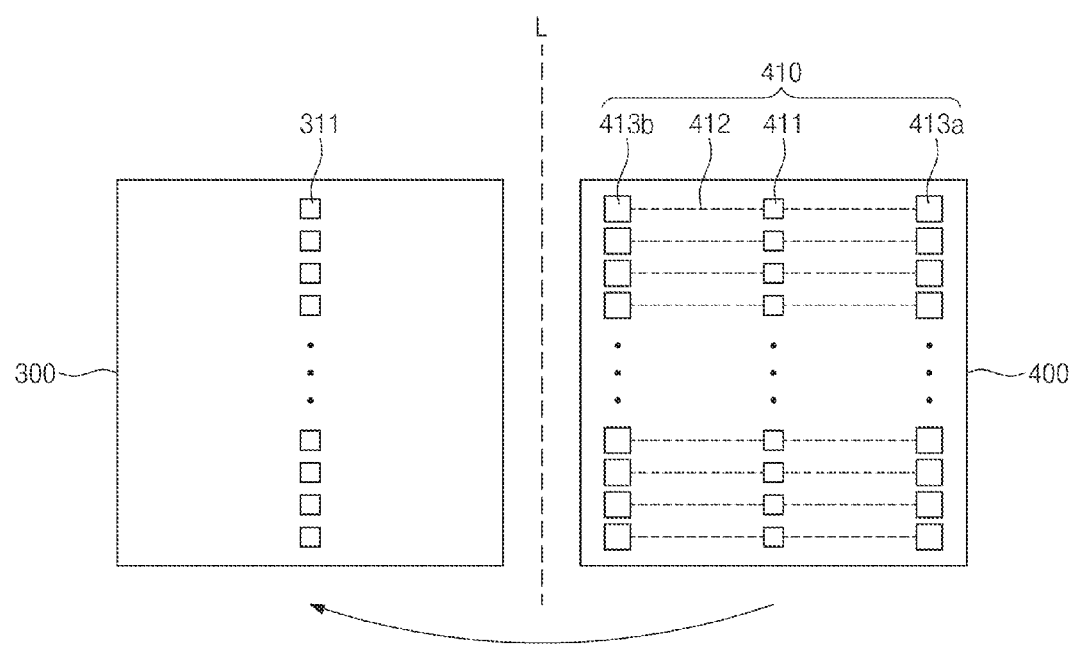
FIG. 7 is a view illustrating coupling relation between a first memory chip and a second memory chip according to some example embodiments of inventive concepts.

FIG. 7 is a view illustrating coupling relation between a first memory chip and a second memory chip according to some example embodiments of inventive concepts. In the present example embodiment, the same descriptions as in example embodiment described with reference to FIG. 1 apply, and as such discussion of the same features is omitted for purposes of ease and convenience in explanation.

Referring to FIGS. 5 to 7, and more particularly with respect to FIGS. 5 and 6, a semiconductor package 3 may include a first memory chip 300 having at least one first electrode pad 311 and a second memory chip 400 having a redistribution line 410. The first electrode pad 311 may be provided on the first active surface 300a of the first memory chip 300, and the redistribution line 410 may be provided on the second active surface 400a of the second memory chip 400.

In some example embodiments, the first electrode pad 311 may be disposed on a central portion of the first active surface 300a of the first memory chip 300. However, example embodiments of inventive concepts are not limited to a position of the first electrode pad 311. For example, as shown in FIG. 7, the multiple first electrode pads 311 may be provided, and the multiple first electrode pads 311 may be arranged in one direction and may be spaced apart from each other.

The redistribution line 410 on the second memory chip 400 may include multiple second electrode pads 411, multiple first metal lines 412, multiple third connection pads 413a, and multiple fourth connection pads 413b. The multiple second electrode pads 411 may be arranged in one direction and may be spaced apart from each other. The multiple second electrode pads 411 may be connected to an inner circuit (not shown) provided in the second memory chip 400. The multiple third connection pads 413a and the multiple fourth connection pads 413b may be electrically connected to the multiple second electrode pads 411 through the multiple first metal lines 412. The multiple third connection pads 413a and the multiple fourth connection pads 413b may be symmetrical with respect to the multiple second electrode pads 411.

Referring to FIG. 7, when the second memory chip 400 is rotated 180 degrees with respect to a reference line L, and is then stacked on the first memory chip 300 in such a way that the first and second memory chips 300 and 400 constitute an offset structure such that the multiple first electrode pads 311 may vertically overlap with the multiple third connection pads 413a, respectively. The multiple first electrode pads 311 may be electrically connected to the multiple third connection pads 413a through multiple first solder bumps 350.

According to the present example embodiment, an additional redistribution line may not be formed on the first memory chip 300 but the redistribution line 410 may be formed on the second memory chip 400, thereby manufacturing the semiconductor package 3. The first memory chip 300, the second memory chip 400, and the substrate 100 may be electrically connected to each other through the redistribution line 410 of the second memory chip 400 without a TSV process or a wire bonding process.

The same signals and/or the same data may be transmitted to the multiple first electrode pads 311 and the multiple third connection pads 413a, which are electrically connected to each other. Thus, the first and second memory chips 300 and 400 may be controlled at the same time by one chip selection signal (CS) transmitted from the logic chip 200.

Figure 8:
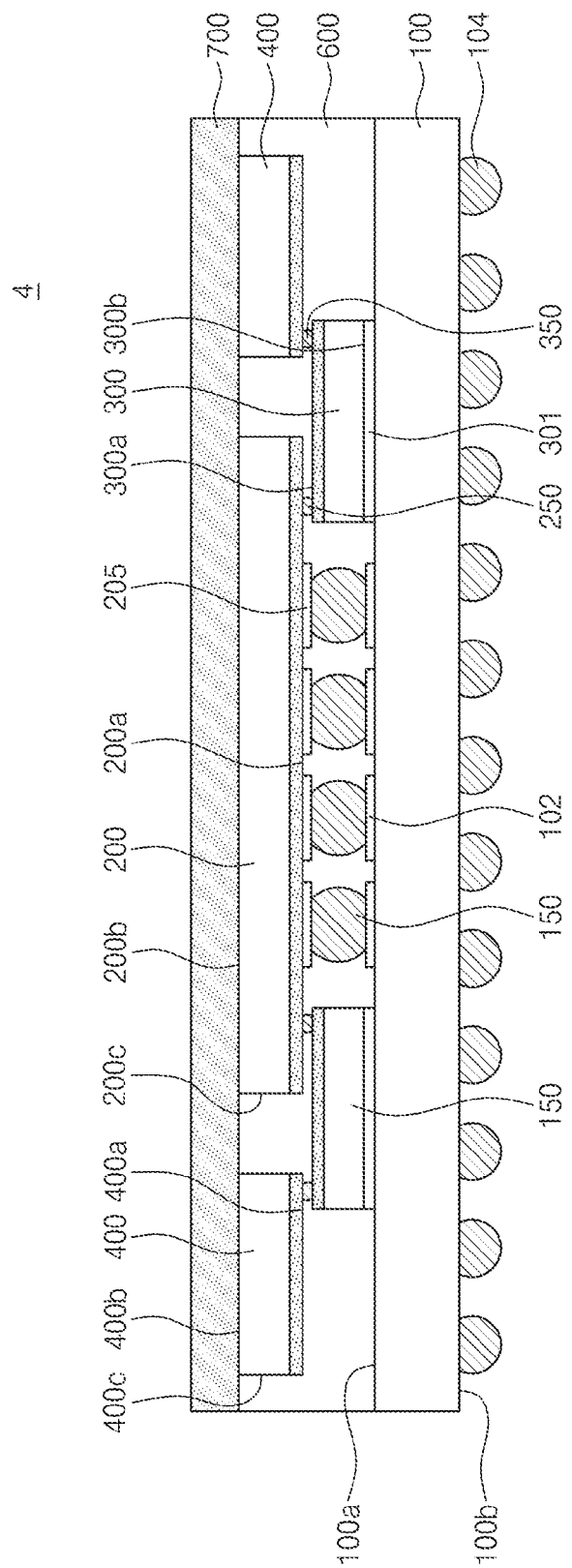
FIG. 8 is a cross-sectional view illustrating a semiconductor package according to some example embodiments of inventive concepts.

FIG. 8 is a cross-sectional view illustrating a semiconductor package according to some example embodiments of inventive concepts.

Figure 9:
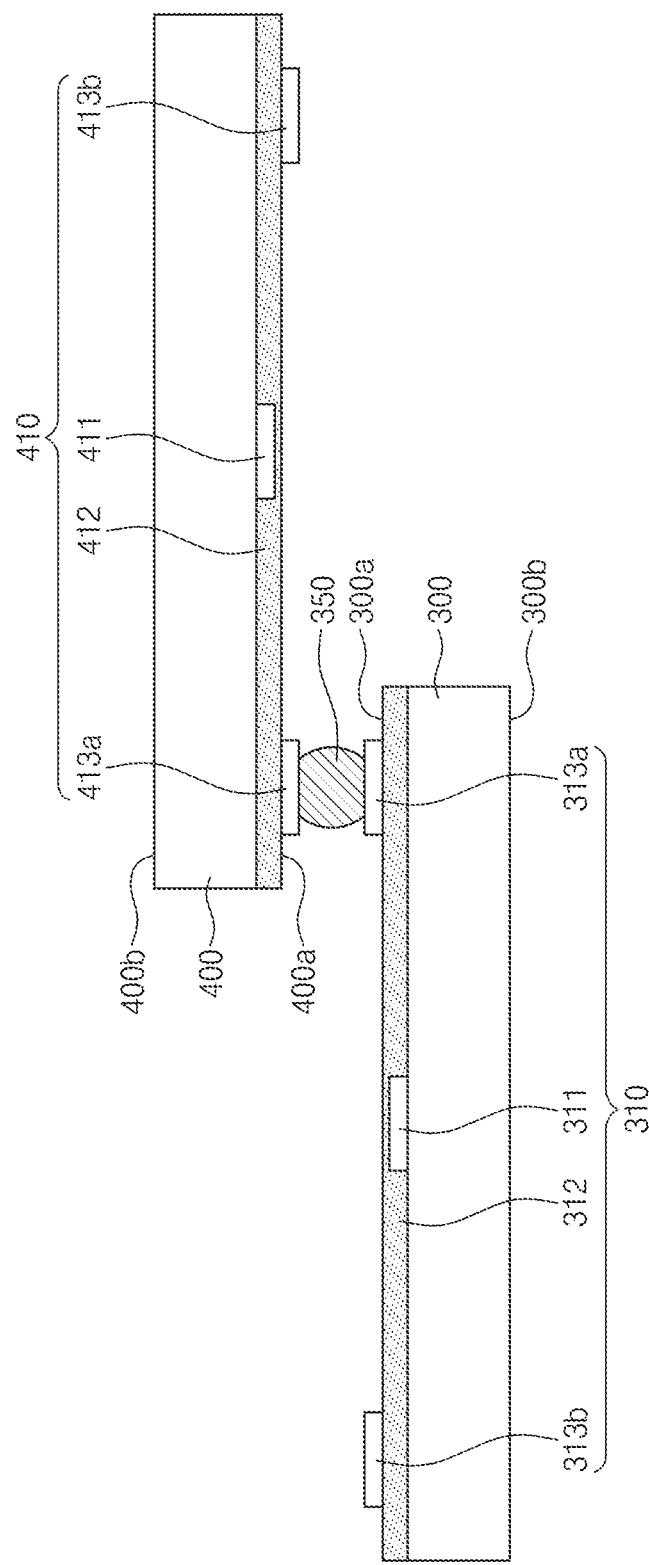
FIG. 9 is a cross-sectional view illustrating memory chips according to some example embodiments of inventive concepts.

FIG. 9 is a cross-sectional view illustrating memory chips according to some example embodiments of inventive concepts. In the present example embodiment, the same descriptions as in the example embodiment described with reference to FIG. 1 apply, and as such discussion of the same features is omitted for purposes of ease and convenience in explanation.

Referring to FIGS. 8 and 9, a semiconductor package 4 may include a substrate 100, a logic chip 200, a first memory chip 300, a second memory chip 400, and a mold layer 600.

The logic chip 200 may be mounted on a top surface 100a of the substrate 100. The logic chip 200 may include an active surface 200a facing the substrate 100, a non-active surface 200b opposite to the active surface 200a, and sidewalls 200c connected between edges of the active surface 200a and edges of the non-active surface 200b. The logic chip 200 may be electrically connected to the substrate 100 through at least one connection terminal 150.

The first memory chip 300 may be disposed on the top surface 100a of the substrate 100. One or more first memory chips 300 may be provided. For example, a plurality of first memory chips 300 may be provided. The plurality of first memory chips 300 may be spaced apart from each other on the substrate 100. The first memory chip 300 may have a first active surface 300a facing the logic chip 200 and a first non-active surface 300b opposite to the first active surface 300a. The first non-active surface 300b may face the substrate 100. The first memory chip 300 may be disposed under the logic chip 200, and the first active surface 300a of the first memory chip 300 may face the active surface 200a of the logic chip 200. The first memory chip 300 may be bonded to the top surface 100a of the substrate 100 by an adhesive layer 301.

Referring to FIG. 9, the first memory chip 300 may have a first redistribution line 310. The first redistribution line 310 may include a first electrode pad 311, a first metal line 312, a first connection pad 313a, and a second connection pad 313b. The first connection pad 313a and the second connection pad 313b may be bilaterally symmetrical with respect to the first electrode pad 311. The first connection pad 313a and the second connection pad 313b may be electrically connected to the first electrode pad 311 through the first metal line 312. The second connection pad 313b may be electrically connected to the logic chip 200 through a solder bump 250, as shown in FIG. 8, and thus the first memory chip 300 may be electrically connected to the logic chip 200. The solder bump 250 may include at least one of tin (Sn), lead (Pb), nickel (Ni), gold (Au), silver (Ag), copper (Cu), or bismuth (Bi).

Still referring to FIG. 9, the second memory chip 400 may be disposed on the first memory chip 300. One or more second memory chips 400 may be provided. The second memory chip 400 may have a second active surface 400a facing the substrate 100, a second non-active surface 400b opposite to the second active surface 400a, and sidewalls 400c connected between edges of the second active surface 400a and edges of the second non-active surface 400b. One sidewall 400c of the second memory chip 400 may face one sidewall 200c of the logic chip 200, and the second non-active surface 400b of the second memory chip 400 may be disposed at the same level as the non-active surface 200b of the logic chip 200. The second memory chip 400 may have a second redistribution line 410. The second redistribution line 410 may include a second electrode pad 411, a second metal line 412, a third connection pad 413a, and a fourth connection pad 413b. The third connection pad 413a and the fourth connection pad 413b may be bilaterally symmetrical with respect to the second electrode pad 411. The third connection pad 413a and the fourth connection pad 413b may be electrically connected to the second electrode pad 411 through the second metal line 412. The third connection pad 413a may vertically overlap with the first connection pad 313a. The third connection pad 413a may be electrically connected to the first connection pad 313a through a first solder bump 350.

The first redistribution line 310 of the first memory chip 300 may have the same structure as the second redistribution line 410 of the second memory chip 400. The first and second memory chips 300 and 400 may be formed on a wafer by the same semiconductor processes and may be separated from each other by performing a singulation process on the wafer.

Referring back to FIG. 8, the mold layer 600, included in the semiconductor package 4, may cover the sidewalls 200c of the logic chip 200, the first memory chip 300, and the sidewalls 400c of the second memory chip 400. The mold layer 600 may expose the non-active surface 200b of the logic chip 200 and the second non-active surfaces 400b of the second memory chips 400. A top surface of the mold layer 600 may be disposed at the same level as the non-active surface 200b of the logic chip 200 and the second non-active surface 400b of the second memory chip 400.

As shown in FIG. 8, a heat dissipation layer 700 included in the semiconductor package 4 may be disposed on the mold layer 600. The heat dissipation layer 700 may cover the non-active surface 200b of the logic chip 200 and the second non-active surface 400b of the second memory chip 400. The heat dissipation layer 700 may be in direct contact with the non-active surface 200b of the logic chip 200 and the second non-active surface 400b of the second memory chip 400 to exhaust heat generated from the logic chip 200 and the second memory chip 400.

According to some example embodiments of inventive concepts, the first memory chip 300 and the second memory chip 400 may not be connected directly to the substrate 100 but may be electrically connected to the substrate 100 through the logic chip 200. The logic chip 200 may transmit signals and/or data to the first and second memory chips 300 and 400, which are electrically connected to each other.

In addition, the logic chip 200 may be electrically connected to the memory chips 300 and 400 without a TSV process, and thus a process cost of the semiconductor package 4 may be reduced. Furthermore, since a wire bonding process is not used, the semiconductor package 1 can be thinned.

Figure 10:
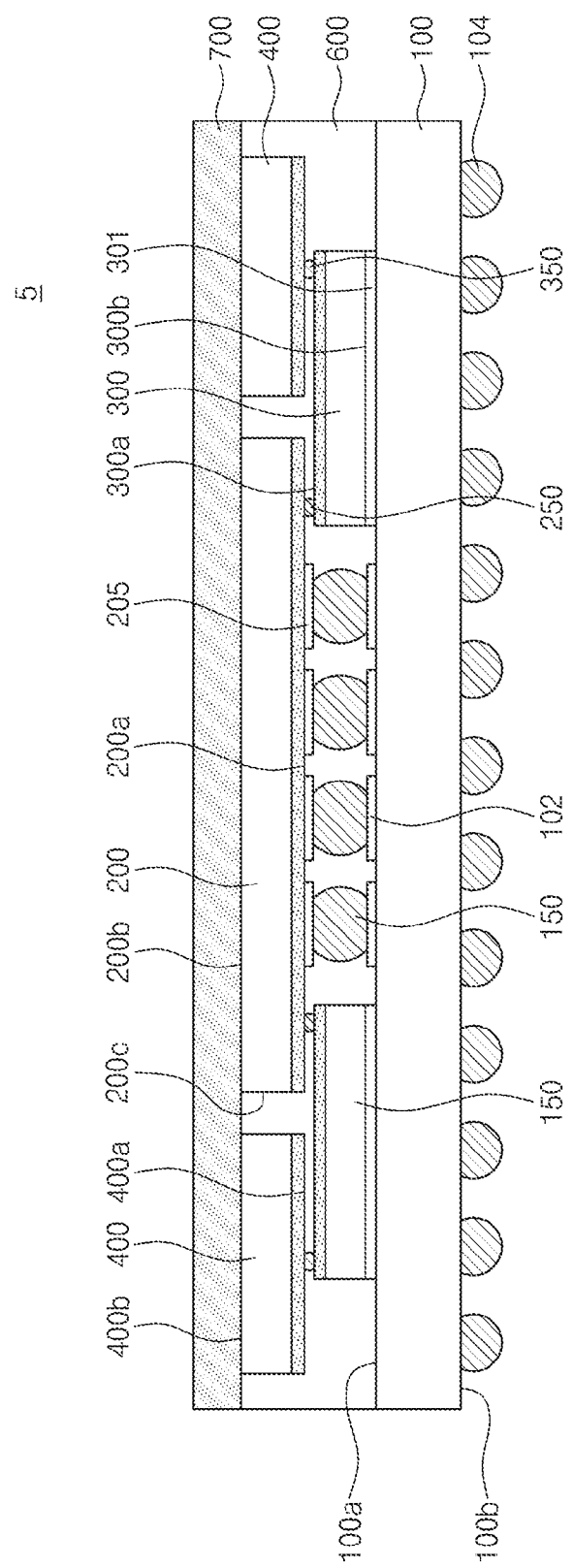
FIG. 10 is a cross-sectional view illustrating a semiconductor package according to some example embodiments of inventive concepts.
Figure 11:
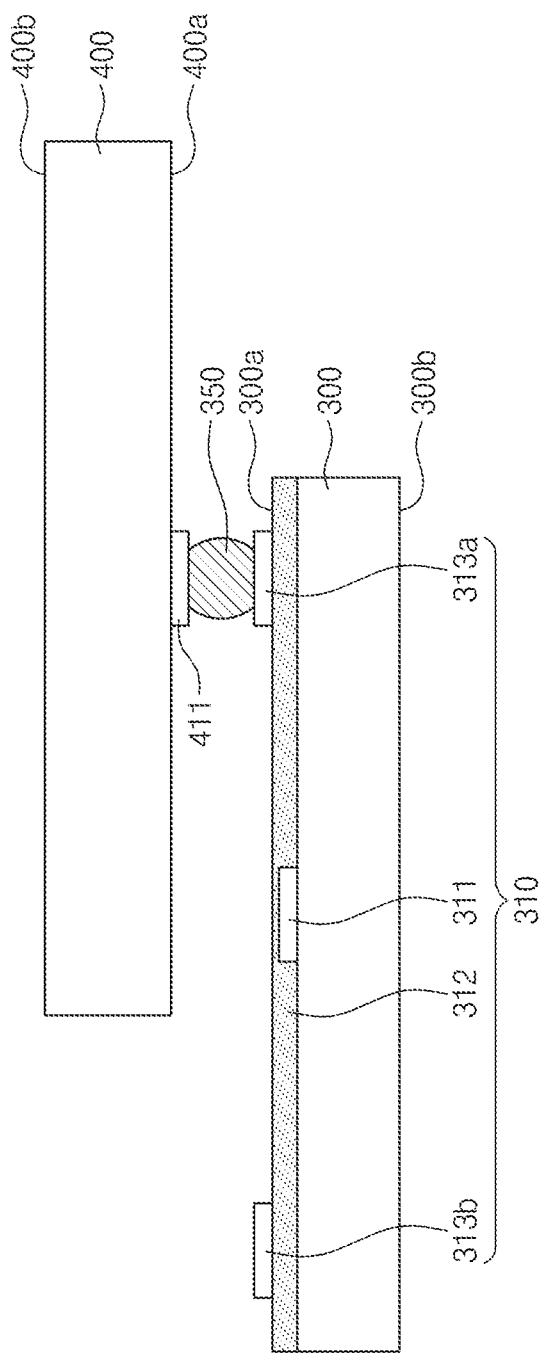
FIG. 11 is a cross-sectional view illustrating memory chips according to some example embodiments of inventive concepts.

FIG. 10 is a cross-sectional view illustrating a semiconductor package according to some example embodiments of inventive concepts, and FIG. 11 is a cross-sectional view illustrating memory chips according to some example embodiments of inventive concepts. In the present embodiment, the same descriptions as in the embodiment described with reference to FIG. 8 apply, and as such discussions of the same features are omitted for purposes of ease and convenience in explanation.

Referring to FIGS. 10 and 11, a semiconductor package 5 may include a first memory chip 300 having a redistribution line 310 and a second memory chip 400 having at least one second electrode pad 411. The redistribution line 310 may be provided on the first active surface 300a of the first memory chip 300, and the second electrode pad 411 may be provided on the second active surface 400a of the second memory chip 400.

The redistribution line 310 may include a first electrode pad 311, a first metal line 312, a first connection pad 313a, and a second connection pad 313b. The first electrode pad 311 may be connected to an inner circuit (not shown) provided in the first memory chip 300. The first connection pad 313a and the second connection pad 313b may be electrically connected to the first electrode pad 311 through the first metal line 312. The first connection pad 313a and the second connection pad 313b may be symmetrical with respect to the first electrode pad 311.

The second electrode pad 411 may be disposed on a central portion of the second active surface 400a. However, example embodiments of inventive concepts are not limited to the position of the second electrode pad 411.

The first active surface 300a of the first memory chip 300 may face the second active surface 400a of the second memory chip 400. The first connection pad 313a may vertically overlap with the second electrode pad 411. The first connection pad 313a may be electrically connected to the second electrode pad 411 through a first solder bump 350.

According to the present example embodiment, an additional redistribution line may not be formed on the second memory chip 400 but the redistribution line 310 may be formed on the first memory chip 300, thereby manufacturing the semiconductor package 5. The first memory chip 300, the second memory chip 400, and the substrate 100 may be electrically connected to each other through the redistribution line 310 of the first memory chip 300 without a TSV process or a wire bonding process.

Figure 12:
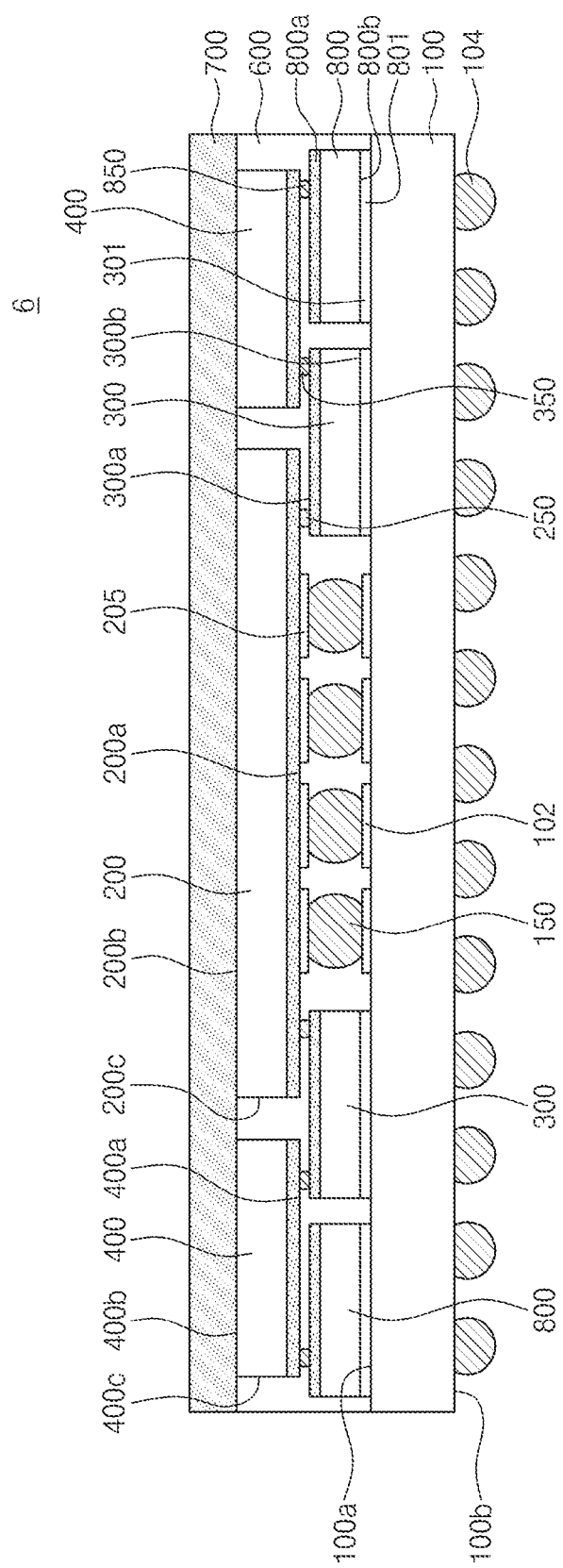
FIG. 12 is a cross-sectional view illustrating a semiconductor package according to some example embodiments of inventive concepts.
Figure 13:
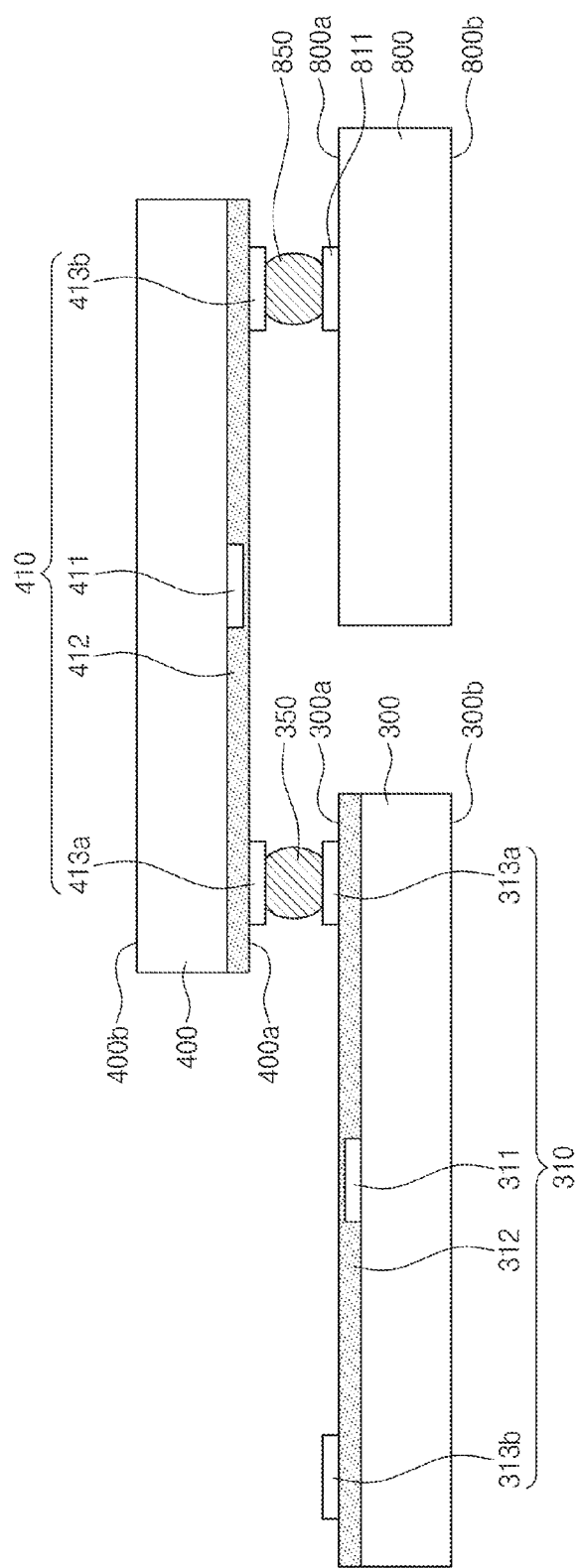
FIG. 13 is a cross-sectional view illustrating memory chips according to some example embodiments of inventive concepts.

FIG. 12 is a cross-sectional view illustrating a semiconductor package according to some example embodiments of inventive concepts, and FIG. 13 is a cross-sectional view illustrating memory chips according to some example embodiments of inventive concepts. In the present embodiment, the same descriptions as in example embodiment described with reference to FIG. 8 apply, and as such discussion of the same features is omitted for purposes of ease and convenience in explanation.

Referring to FIGS. 12 and 13, a semiconductor package 6 may include a logic chip 200, a first memory chip 300, a second memory chip 400, and a third memory chip 800 which are disposed on a substrate 100. Arrangement and coupling relation of the logic chip 200, the first memory chip 300, and the second memory chip 400 may be the same or similar as described with reference to FIG. 8, and thus the descriptions thereto will be omitted.

As shown in FIG. 12, the third memory chip 800 may be disposed between the substrate 100 and the second memory chip 400. One or more third memory chips 800 may be provided. For example, a plurality of the third memory chip 800 may be provided, and the plurality of third memory chips 800 may be laterally spaced apart from the first memory chip 300.

As shown in FIG. 13, the third memory chip 800 may have a third active surface 800a facing the second memory chip 400 and a third non-active surface 800b facing the substrate 100. A third electrode pad 811 may be provided on the third active surface 800a. The third electrode pad 811 may be disposed on a central portion of the third active surface 800a. However, example embodiments of inventive concepts are not limited to the position of the third electrode pad 811. For example, the third memory chip 800 may include a dynamic random-access memory (DRAM) device, a static random-access memory (SRAM) device, a flash memory device, a phase change random-access memory (PRAM) device, a resistive random-access memory (Re-RAM) device, a ferroelectric random-access memory (Fe-RAM) device, or a magneto-resistive random-access memory (MRAM) device. However, example embodiments of inventive concepts are not limited thereto. The third memory chip 800 may be bonded to the top surface 100a of the substrate 100 by an adhesive layer 801.

Still referring to FIG. 13, the third active surface 800a of the third memory chip 800 may face the second active surface 400a of the second memory chip 400. The fourth connection pad 413b of the second memory chip 400 may vertically overlap with the third electrode pad 811 of the third memory chip 800. The third electrode pad 811 may be electrically connected to the fourth connection pad 413b through a third solder bump 850. The third solder bump 850 may include at least one of tin (Sn), lead (Pb), nickel (Ni), gold (Au), silver (Ag), copper (Cu), or bismuth (Bi).

According to some example embodiments of inventive concepts, the semiconductor package may be formed using the memory chips which are formed on the wafer by the same semiconductor processes and are separated from the wafer, and the active surfaces of the memory chips may face each other in the semiconductor package. Thus, the memory chips and the logic chip may be electrically connected to each other without a TSV process and/or a wire bonding process.

According to some example embodiments of inventive concepts, the active surfaces of the memory chips on which the redistribution lines having the same structure are formed may face each other in the semiconductor package. Thus, the semiconductor package may be manufactured without the TSV process. As a result, the manufacture cost of the semiconductor package may be reduced.

While inventive concepts have been described with reference to example embodiments, it will be apparent to those skilled in the art that various changes and modifications may be made without departing from the spirits and scopes of inventive concepts. Therefore, it should be understood that the above example embodiments are not limiting, but illustrative. Thus, the scope of inventive concepts are to be determined by the broadest permissible interpretation of the following claims and their equivalents, and shall not be restricted or limited by the foregoing description.

What is claimed is:

1. A semiconductor package comprising:
   a logic chip on a substrate;
   a first memory chip on the logic chip, the first memory chip including a first active surface and a first non-active surface;
   a second memory chip on the first memory chip, the first memory chip being offset from the second memory chip, the second memory chip including a second active surface and a second non-active surface, the first active surface and the second active surface oppose each other and are operatively connected to each other through a first solder bump; and
   a mold layer covering the logic chip, the first memory chip, and sidewalls of the second memory chip, a non-active surface of the logic chip and the second non-active surface of the second memory chip being exposed, wherein
   the first memory chip includes a first redistribution line on the first active surface,
   the second memory chip includes a second redistribution line on the second active surface,
   each of the first redistribution line and the second redistribution line has a bilateral symmetrical structure and a same structure, and
   the logic chip is electrically connected to the first memory chip and the second memory chip through the substrate.

2. The semiconductor package of claim 1, wherein
   the second redistribution line is operatively connected to the first memory chip through the first solder bump, and
   the second redistribution line is operatively connected to the substrate through a bonding member, and
   the bonding member is one of an interposer, a pillar, and a through-mold via (TMV).

3. The semiconductor package of claim 2, wherein the second redistribution line comprises:
   an electrode pad on a central portion of the second active surface;
   a first connection pad on a first edge of the second active surface, the first connection pad operatively connected to the electrode pad; and
   a second connection pad on a second edge of the second active surface, the second edge opposite to the first edge, the second connection pad operatively connected to the electrode pad, the first connection pad is operatively connected to the first memory chip, and the second connection pad is operatively connected to the substrate.

4. The semiconductor package of claim 1, wherein
   the first redistribution line is operatively connected to the second memory chip through the first solder bump, and
   the first redistribution line is operatively connected to the logic chip through a second solder bump.

5. The semiconductor package of claim 4, wherein the first redistribution line comprises:

an electrode pad on a central portion of the first active surface;

a first connection pad on a first edge of the first active surface, the first connection pad operatively connected to the electrode pad; and a second connection pad on a second edge of the first active surface, the second edge opposite to the first edge, the second connection pad operatively connected to the electrode pad, the first connection pad is operatively connected to the second memory chip, and the second connection pad is operatively connected to the logic chip.

6. A semiconductor package comprising:

a first distribution line including a first connection pad and an electrode pad, the first distribution line on a first surface of a first memory chip;

a second distribution line including a second connection pad, the second distribution line on a second surface of a second memory chip, the first surface and the second surface oppose each other by having a central portion of the first memory chip offset from a central portion of the second memory chip such that at least one of the first connection pad and the electrode pad align with the second connection pad along a vertical axis to operatively connect the first and second memory chips, the first distribution line and the second distribution line being bilaterally symmetrical and having a same structure; and a mold layer covering a logic chip, the first memory chip, and sidewalls of the second memory chip.

7. The semiconductor package of claim 6, wherein the first connection pad is on a first edge of the first memory chip, the second connection pad is on a first edge of the second memory chip, and the first edge of the first memory chip and the first edge of the second memory chip align along the vertical axis such that the first and second memory chips are operatively connected.

8. The semiconductor package of claim 6, wherein the electrode pad is on the central portion of the first memory chip, the second connection pad is on a first edge of the second memory chip, and the central portion of the first memory chip and the first edge of the second memory chip align along the vertical axis such that the first and second memory chips are operatively connected.

9. The semiconductor package of claim 7, further comprising:

a solder bump between the first edge of the first memory chip and the first edge of the second memory chip, the solder bump operatively connecting the first and second memory chips and the first connection pad aligning with the second connection pad along the vertical axis.

10. The semiconductor package of claim 8, further comprising:

a solder bump between the central portion of the first memory chip and the first edge of the second memory chip, the solder bump operatively connecting the first and second memory chips and the electrode pad aligns with the second connection pad along the vertical axis.

11. The semiconductor package of claim 1, wherein the first active surface and the second active surface are mirror-symmetrical.

12. The semiconductor package of claim 1, further comprising:

a heat dissipation layer on the exposed second non-active surface of the second memory chip, and the mold layer.

* * * * *